US006819601B2

United States Patent
Eliason et al.

(10) Patent No.: US 6,819,601 B2
(45) Date of Patent: Nov. 16, 2004

(54) PROGRAMMABLE REFERENCE FOR 1T/1C FERROELECTRIC MEMORIES

(75) Inventors: Jarrod Eliason, Colorado Springs, CO (US); Bill Kraus, Palmer Lake, CO (US); Hugh McAdams, McKinney, TX (US); Scott Summerfelt, Garland, TX (US); Theodore S. Moise, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/454,862

(22) Filed: Jun. 5, 2003

(65) Prior Publication Data

US 2004/0174750 A1 Sep. 9, 2004

Related U.S. Application Data

(60) Provisional application No. 60/452,658, filed on Mar. 7, 2003.

(51) Int. Cl.[7] .............................................. G11C 7/00
(52) U.S. Cl. .................................. 365/189.09; 365/145
(58) Field of Search ........................... 365/145, 189.09, 365/189.07, 210

(56) References Cited

U.S. PATENT DOCUMENTS

| | | | | |
|---|---|---|---|---|
| 5,212,413 A | * | 5/1993 | Phelan et al. ............... | 327/537 |
| 5,956,266 A | | 9/1999 | Wilson et al. | |
| 6,529,240 B2 | | 3/2003 | Tan et al. | |
| 6,721,198 B2 | * | 4/2004 | Kang ......................... | 365/145 |

OTHER PUBLICATIONS

"A 42.5mm$^2$ 1Mb Nonvolatile Ferroelectric Memory Utilizing Advanced Architecture for Enhanced Reliability", William Kraus, Lark Lehman, Dennis Wilson, Tatsuya Yamazaki, Chikai Ohno, Eiichi Nagai, Hirokazu Yamazaki and Hideaki Suzuki, Published in the 1998 Symposium on VLSI Circuits Digest of Technical Papers, pp. 242–245. The conference was sponsored by IEEE and Japan Society of Applied Physics.

"A Pulse–Tuned Charge Controlling Scheme for Uniform Main and Reference Bitline Voltage Generation on 1T1C FeRAM", Hee–Bok Kang, Hun–Woo Kye, Duck–Ju Kim, Geun–Il Lee, Je–Hoon Park, Jae–Kyung Wee, Seaung–Suk Lee, Suk–Kyoung Hong, Nam–See Kang and Jin–Yong Chung, 2001 IEEE, Symposium on VLSI Circuits Digest of Technical Papers, 2 pgs.

* cited by examiner

Primary Examiner—Tan T. Nguyen
(74) Attorney, Agent, or Firm—Jacqueline J. Garner; W. James Brady, III; Frederick J. Telecky, Jr.

(57) ABSTRACT

A ferroelectric memory device is disclosed and comprises a logic programmable capacitance reference circuit. The circuit is adapted to generate a reference voltage during a sense mode of operation, wherein the reference voltage comprises a value that is a function of one or more memory conditions. The memory device further comprises a bit line pair, wherein a first bit line of the bit line pair has a ferroelectric capacitor coupled thereto for sensing thereof, and a second bit line of the bit line pair is coupled to the reference voltage. A sense circuit is coupled to the bit line pair and is configured to detect a data state associated with the ferroelectric capacitor using a voltage associated with the first bit line and the reference voltage on the second bit line.

17 Claims, 10 Drawing Sheets

Column specific reference

Averaged, shared reference

PROGRAMMABLE REFERENCE FOR 1T/1C FERROELECTRIC MEMORIES

RELATED APPLICATION

This application claims priority to Ser. No. 60/452,658 filed Mar. 7, 2003, which is entitled "Programmable Reference for 1T1C Ferroelectric Memories".

FIELD OF INVENTION

The present invention relates generally to semiconductor devices and more particularly to apparatus and methods for generating a reference voltage to sense data stored in memory devices.

BACKGROUND OF THE INVENTION

Ferroelectric memory devices, and other type semiconductor memories, are used for storing data and/or program code in personal computer systems, embedded processor-based systems, and the like. Ferroelectric memories are commonly organized in single-transistor, single-capacitor (1T1C) or two-transistor, two-capacitor (2T2C) configurations, in which data is read from or written to the device using address signals and various other control signals. The individual memory cells typically comprise one or more ferroelectric (FE) capacitors adapted to store a binary data bit, as well as one or more access transistors, typically MOS devices, operable to selectively connect the FE capacitor to one of a pair of complimentary bit lines, with the other bit line being connected to a reference voltage. The individual cells are commonly organized as individual bits of a corresponding data word, wherein the cells of a given word are accessed concurrently through activation of plate lines and word lines by address decoding circuitry.

Ferroelectric memory devices provide non-volatile data storage where data memory cells include capacitors constructed with ferroelectric dielectric material which may be polarized in one direction or another in order to store a binary value. The ferroelectric effect allows for the retention of a stable polarization in the absence of an applied electric field due to the alignment of internal dipoles within Perovskite crystals in the dielectric material. This alignment may be selectively achieved by application of an electric field to the ferroelectric capacitor in excess of the coercive field of the material. Conversely, reversal of the applied field reverses the internal dipoles. The response of the polarization of a ferroelectric capacitor to the applied voltage may be plotted as a hysteresis curve.

Data in a 1T1C type ferroelectric data cell is read by connecting a reference voltage to a first bit line and connecting the cell ferroelectric capacitor between a complimentary bit line and a plate line signal voltage, and interrogating the cell. There are several techniques to interrogate a FeRAM cell. Two most common interrogation techniques are on-pulse sensing and after-pulse sensing. In both these interrogation techniques, the cell capacitor is coupled to the complimentary bit line by turning ON an access or a pass gate. In the on-pulse sensing, the plate line voltage is stepped from ground (Vss) to a supply voltage (Vdd). In the after-pulse sensing the plate line voltage is pulsed from Vss to Vdd and then back to Vss. In either case, the application of the voltage to the plate line provides a differential voltage on the bit line pair, which is connected to a sense amp circuit. The reference voltage is typically supplied at an intermediate voltage between a voltage ($V_{"0"}$) associated with a capacitor programmed to a binary "0" and that of the capacitor programmed to a binary "1" ($V_{"1"}$). The resulting differential voltage at the sense amp terminals represents the data stored in the cell, which is buffered and applied to a pair of local IO lines.

The transfer of data between the ferroelectric memory cell, the sense amp circuit, and the local data bit lines is controlled by various access transistors, typically MOS devices, with switching signals being provided by control circuitry in the device. In a typical ferroelectric memory read sequence, two sense amp bit lines are initially pre-charged to ground, and then floated, after which a target ferroelectric memory cell is connected to one of the sense amp bit lines and interrogated. Thereafter, a reference voltage is connected to the remaining sense amp bit line, and a sense amp senses the differential voltage across the bit lines and latches a voltage indicative of whether the target cell was programmed to a binary "0" or to a "1".

Figure 1:
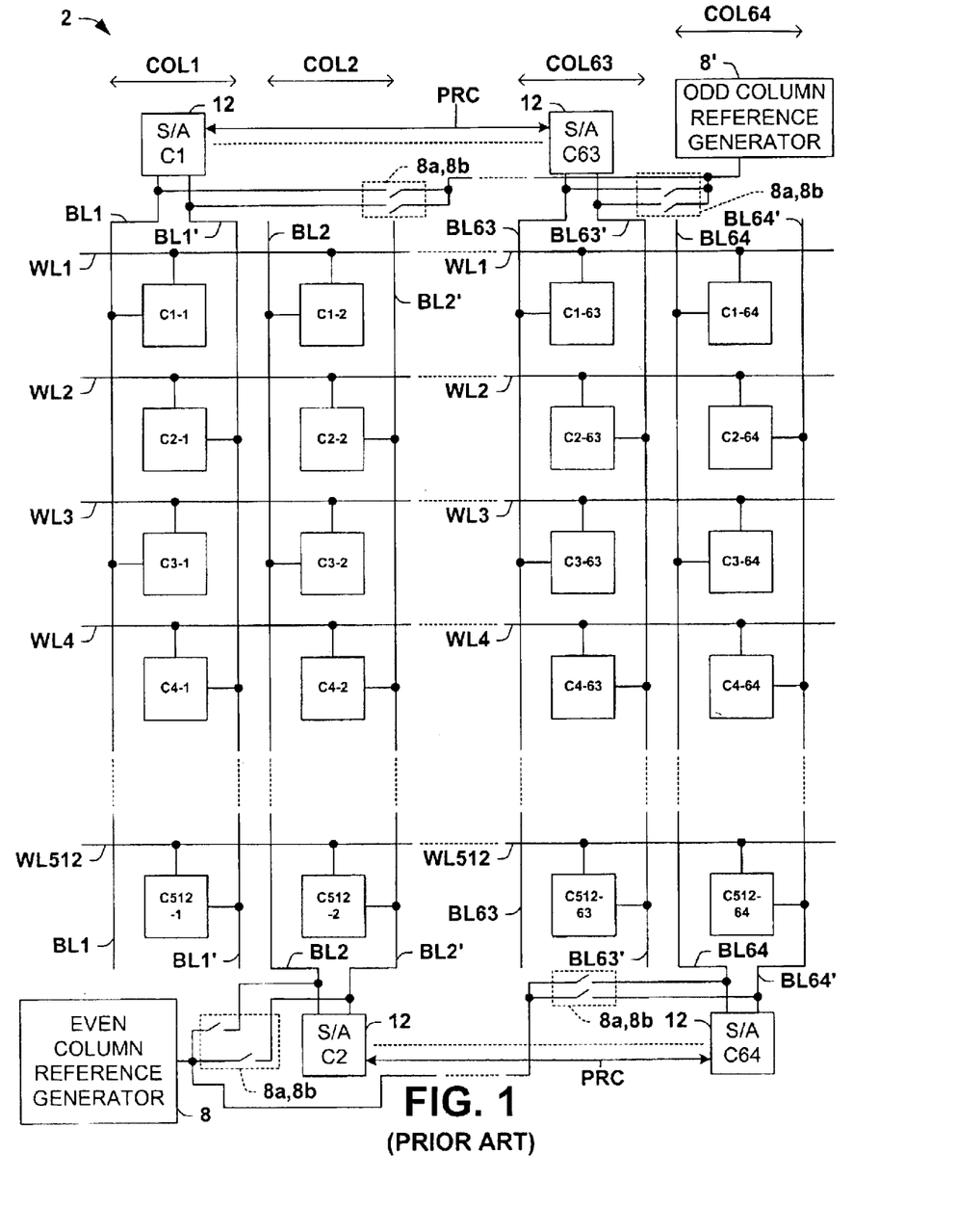
FIG. 1 is a schematic diagram illustrating a segment portion of a conventional folded bit line ferroelectric memory device.
Figure 2:
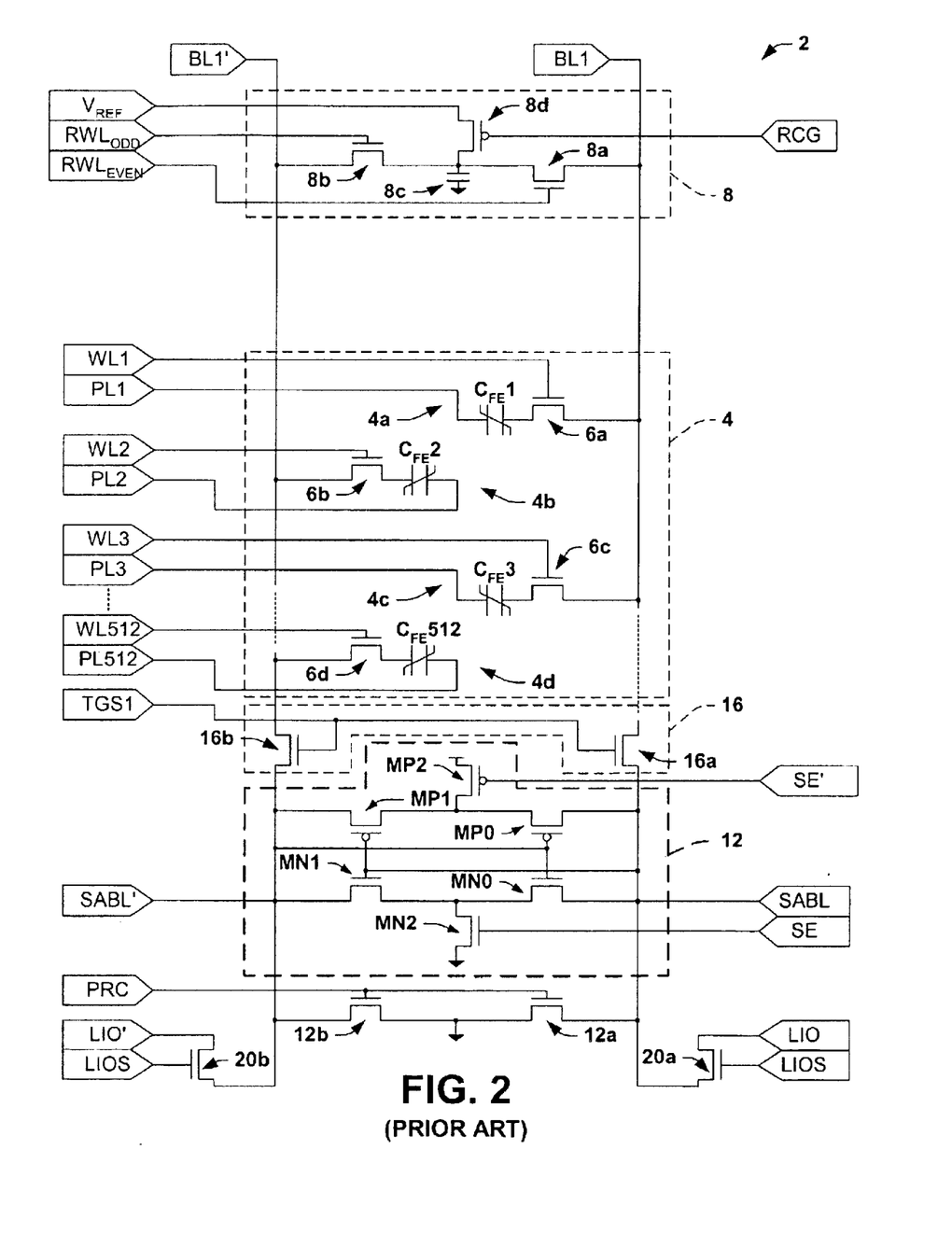
FIG. 2 is a schematic diagram illustrating a portion of a column of the memory device of FIG. 1.

FIG. 1 schematically illustrates an exemplary, conventional segment portion of a memory device 2 having 512 rows (words) and 64 columns (bits) of data storage cells CROW-COLUMN configured in a folded bit line architecture, where each column of cells is accessed via a pair of complimentary bit lines $BL_{COLUMN}$ and $BL_{COLUMN}'$. One exemplary column of the device 2 is illustrated in prior art FIG. 2. The cells C1-1 through C1-64 form a data word accessible via a word line WL1 and complimentary bit line pairs BL1/BL1' through BL64/BL64', where cell data is sensed during data read operations using sense amp circuits S/A C1 through S/A C64 associated with columns 1 through 64, respectively. In a typical folded bit line architecture ferroelectric memory device, the cells $C_{ROW\text{-}COLUMN}$ individually include one or more ferroelectric cell capacitors and one or more access transistors to connect the cell capacitors between one of the complimentary bit lines associated with the cell column and a plate line, where the other bit line is connected to a reference voltage.

In the device 2, the sense amps associated with even numbered columns are located at the bottom of the segment, whereas sense amps associated with odd numbered columns are located at the top of the segment. Reference voltages are provided in a variety of differing manners. For example, in the example of prior art FIG. 1, to reduce the number of components in the device 2, as well as to increase device density therein, individual reference voltage generators are not provided for each complimentary bit line pair. Rather, shared reference generators are provided at the top and bottom of the segment columns. An even column reference generator 8 is provided at the bottom of the segment columns to service the sense amps associated with even numbered columns and an odd column reference generator 8' is provided at the top of the segment columns to service the sense amps associated with odd numbered columns. The reference voltages from the generators 8, 8' are coupled to one of the bit lines in the columns using one of a pair of switches 8a, Bb, depending upon whether an odd or even numbered target data word is being read.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

In accordance with one aspect of the invention, a logic programmable reference voltage circuit is provided for a ferroelectric memory. The logic programmable reference voltage circuit is operable to generate a reference voltage value that is variable, and is a function of one or more input control signals. For example, based on a sense technique selected used (e.g., after-pulse or on-pulse sensing), or a type of reference employed (e.g., Da or U), a different reference voltage value may be generated such that errors during a sense mode are substantially reduced.

In another aspect of the present invention, a ferroelectric memory is disclosed that comprises a reference control circuit, a logic programmable reference circuit and a memory block having a 1T1C type memory architecture. The reference control circuit is operable to generate one or more control signals in response to one or more input conditions, such as location data, thermal data, sense methodology data, test mode data, time, and the like. The logic programmable reference circuit receives the control signals from the reference control circuit and generates a capacitance value in response thereto. The capacitance is then coupled to the memory block and forms a capacitor divider with one or more bit lines associated with the block to generate a voltage reference having a value associated with the capacitance value.

In yet another aspect of the present invention, the logic programmable reference circuit comprises a variable capacitance circuit, wherein the variable capacitance circuit is operable to couple a number of capacitances together in parallel based on the control signals from the reference control circuit. The parallel capacitances together form the circuit capacitance that is coupled to the memory block to form the capacitor divider circuit.

In still another aspect of the present invention, the variable capacitance circuit comprises a plurality of capacitances that are weighted with respect to one another in a binary fashion. The capacitances are selectively coupled together in parallel by a plurality of switches that are controlled by the control signals of the reference control circuit. Based on the control signals, one or more of the plurality of switches are activated, thereby selectively coupling the capacitances associated with the activated switches together in parallel to form a collective capacitance for the variable capacitance circuit. One or more bit lines in the memory block are then coupled to the variable capacitance circuit, and the capacitance associated with the bit lines form a capacitor divider circuit with the collective capacitance to form a reference voltage.

In yet another aspect of the present invention, the capacitance in the variable capacitance circuit comprises ferroelectric capacitors that are identical to the ferroelectric capacitors employed in the memory block. The binary weighting in each of the legs of the variable capacitance circuit may be provided by coupling multiple ferroelectric capacitors together in parallel.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

The present invention will now be described with reference to the attached drawings, wherein like reference numerals are used to refer to like elements throughout. The invention relates to a reference voltage circuit, wherein the value of the reference voltage is logically programmable based on one or more input parameters. Accordingly, sense errors are substantially reduced by varying a magnitude of the reference voltage used during a read operation to more effectively center the reference voltage within the sense margin window. One or more input parameters may include, for example, the type of sense technique being utilized, the type of reference being employed, thermal conditions, characterization data, time and location data. A more complete understanding of the logic programmable voltage reference circuit will be appreciated in light of the detailed description below. It will be appreciated by those of ordinary skill in the art, however, that the invention is not limited to the examples provided, and that the illustrations and descriptions provided herein are exemplary in nature.

In order to fully appreciate the various aspects of the present invention, a discussion of how 1T1C ferroelectric memories are sensed typically and how the method of sensing and other factors can result in different results for a given sense voltage will be briefly discussed. As highlighted supra, 1T1C memories employ a reference generation circuit to create a reference voltage between the voltage levels established by non-switching capacitors and switching capacitors, respectively. For example, when a cell is coupled to the bit line (BL), a switching term stores a logical "1" in the capacitor while a non-switching term stores a logical "0" therein. Therefore to correctly sense a stored "1", the reference circuit must generate a bit line bar (BLB) voltage that is less than the voltage the switched capacitor induces on BL. Likewise, to correctly sense a stored "0", the reference circuit must generate a BLB voltage that is greater than the voltage the non-switching capacitor induces on the BL.

In a 1T1C memory architecture, half the ferroelectric memory cells are connected to the bit line (BL) while the other half are connected to the complement bit line (BLB). When a cell is coupled to BLB, a switching term stores a logical "0" while a non-switching term stores a "1" in the ferroelectric capacitor.

To correctly sense a stored "0", the reference circuit must generate a lower voltage on BL than the voltage induced on BLB by the switching capacitor. Similarly, to properly sense a "1", the reference circuit must generate a BL voltage that is greater than the voltage induced by the non-switching capacitor on BLB.

Figure 3:
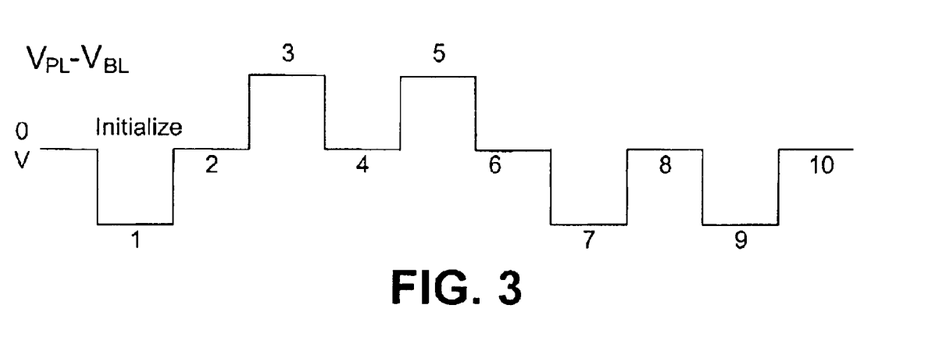
FIG. 3 is a waveform illustrating various pulses employed in altering a polarization associated with a ferroelectric capacitor.
Figure 4:
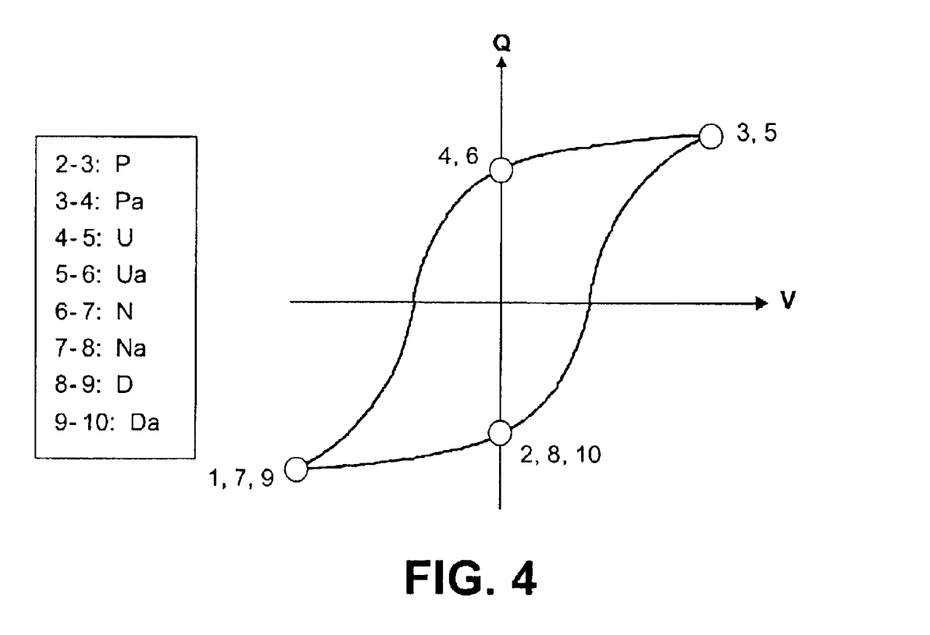
FIG. 4 is a simplified hysteresis loop illustrating polarization states associated with a biasing of a ferroelectric capacitor in accordance with the waveform of FIG. 3.

Switching and non-switching capacitors are often referred to by their respective abbreviations, P and U. FIGS. 3 and 4 provide an illustration of a typical ferroelectric hysteresis loop and a "PUND" data collection waveform. In FIGS. 3 and 4, the hysteresis loop is initialized with a write pulse to a negative polarization (pulse 1). The negative polarization voltage is then removed to begin the pulse train at 2; that is, after the initialization pulse, the capacitor is at point 2 on the hysteresis loop. The plate node of the capacitor is then driven with a positive pulse (2-3) and the positive switching term (P) is observed. The positive voltage pulse is then removed (3-4) for measurement of the positive "after" switching term (Pa). As can be seen in FIG. 4, after the positive pulse, the ferroelectric capacitor is at point 4 on the curve. The plate node of the capacitor is again pulsed positive (4-5) and the "up" data is collected (U), followed by removing the voltage (5-6) for the "up-after" (Ua) term measurement. In the simplified hysteresis loop of FIG. 4, the Pa, U and Ua terms are identical, however, with real world ferroelectric materials employed in the capacitors, these terms are not necessarily the same, and may be affected differently by capacitor operation history.

The "negative" and "down" terms (N, Na, D, Da) are typically collected for materials analysis during characterization. In device operation, the N term is typically observed during a restore operation. Measurement of these terms, however, provides valuable data on capacitor asymmetry.

As discussed above, two common types of ferroelectric capacitor sense techniques are employed in 1T1C type memories. One sense technique is commonly referred to as "after-pulse" or "up-down" sensing. After-pulse sensing is achieved by pulsing the plate line of the ferroelectric capacitor high and returning it low before activating the associated sense amplifier. For after-pulse sensing, P-Pa is analogous to the switching level and U-Ua is analogous to the non-switching level. A second sense technique is commonly referred to as "on-pulse" or "up-only" sensing. For on-pulse sensing, the plate line is pulsed high and held high during sense amplification. In this case, the P and U terms compare to the switching and non-switching levels, respectively.

Depending on various factors, the different sense techniques are found to be advantageous in differing applications. In any event, as cell capacitors become smaller, which is generally desirable, the signal distribution is expected to broaden for on-pulse terms P and U, however, a tighter distribution is anticipated for after-pulse terms P-Pa and U-Ua. For example, as illustrated in the simplified hysteresis loop of FIG. 4, the ideal U-Ua term will always be zero (0), and the P-Pa term will be some number that is significantly greater. Retention loss mechanisms over time and operation, however, cause the U-Ua term to increase and the P-Pa term to decrease. In such instances, the reference voltage must be set between these terms to provide the longest possible product life. Unfortunately, if the design of the reference voltage circuit is occurring concurrently with ferroelectric capacitor characterization, materials characterization data may not be available, making it difficult or in some cases impossible to predict with confidence where the optimal reference voltage value should be or whether one sensing technique is preferred to another.

Figure 5:
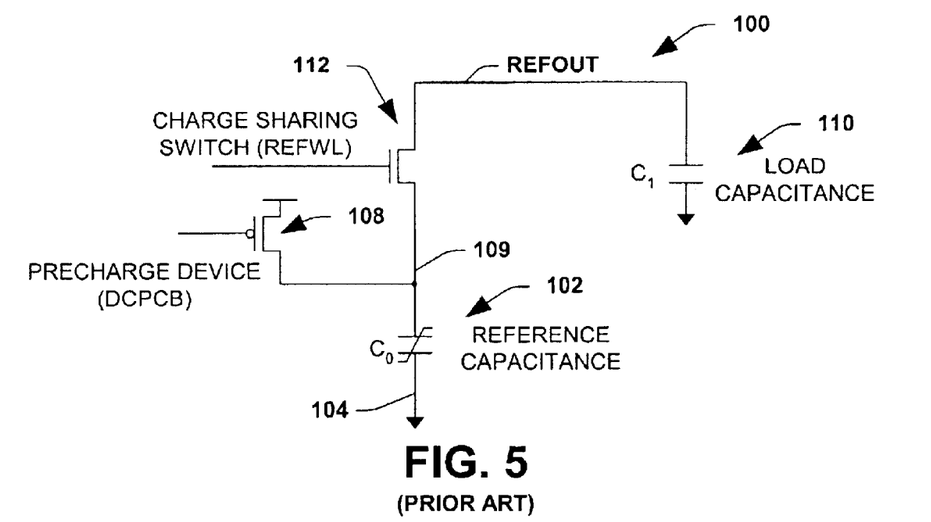
FIG. 5 is a schematic diagram illustrating a conventional Da type reference voltage circuit.
Figure 6:
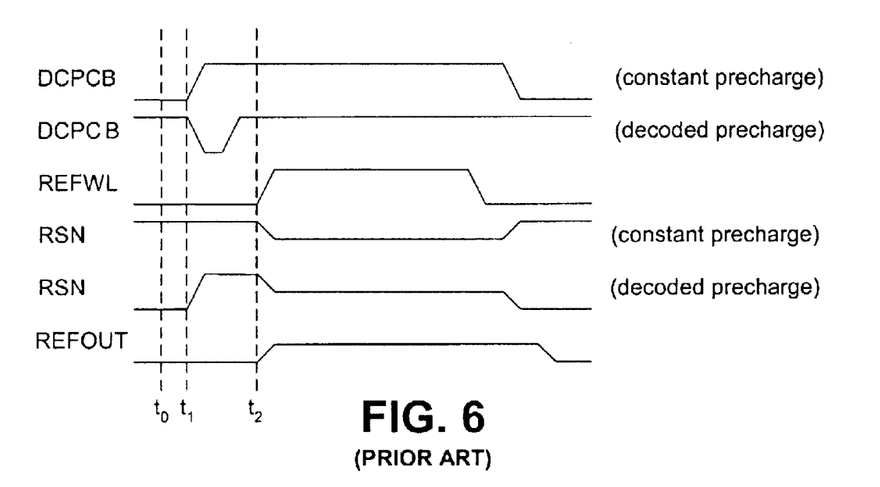
FIG. 6 is a timing diagram illustrating control signals and an output signal associated with the conventional Da type reference voltage circuit of FIG. 5 for constant and decoded precharge type operations, respectively.

In addition to the variations in a target reference voltage based on the sense technique, variations in the reference voltage may occur due to the type of reference voltage circuit employed in the design. For example, FIG. 5 is a schematic diagram of a conventional Da type reference circuit 100, and FIG. 6, is a simplified, exemplary timing diagram for operation thereof. The Da reference circuit 100 comprises a ferroelectric capacitor 102 having a plate line 104 coupled to a fixed potential such as circuit ground, and another plate 106 coupled to a precharge switch 108 such as a PMOS transistor at a reference storage node (RSN) 109. The FeCap 102 is also selectively coupled to a load capacitance 110 through a charge sharing switch 112 such as an NMOS transistor.

Following the timing diagram of FIG. 6, at time $t_0$, DCPCB is low which turns the precharge transistor 108 on, thereby charging the FeCap 102 and causing the RSN 109 to charge up to $V_{DD}$, which places the FeCap 102 at point 9 on the hysteresis loop of FIG. 4. Since the reference capacitor 102 is precharged with RSN high, the capacitor experiences D, Da unipolar pulsing. At $t_1$ DCPCB goes high to turn off PMOS transistor 108 that allows the FeCap 102 to float with a VDD precharge. At $t_2$, the charge sharing switch 112 is turned on when REFWL goes high, and the charge associated with the FeCap 102 is shared with the load capacitor 110 until the voltage equalizes. The final voltage on REFOUT is determined by the capacitor divider as follows:

$$V_{REF}=V_{DD}(C_0/(C_0+C_1)).$$

For the Da reference circuit 100 of FIG. 5, the ferroelectric capacitance will generally exhibit a non-linear capacitance as a function of voltage. However, since the largest capacitance change with voltage occurs near the axis, and the Da reference starts away from the axis and moves toward the axis, the Da reference can be assumed to be generally linear as an approximation. The linearity and stability of the Da reference, however, are not intended to track the history dependence of the ferroelectric material established during sensing. Further, since several memory cells may share the reference circuit, it is difficult to guarantee that the reference history matches the memory cell history.

Figure 7:
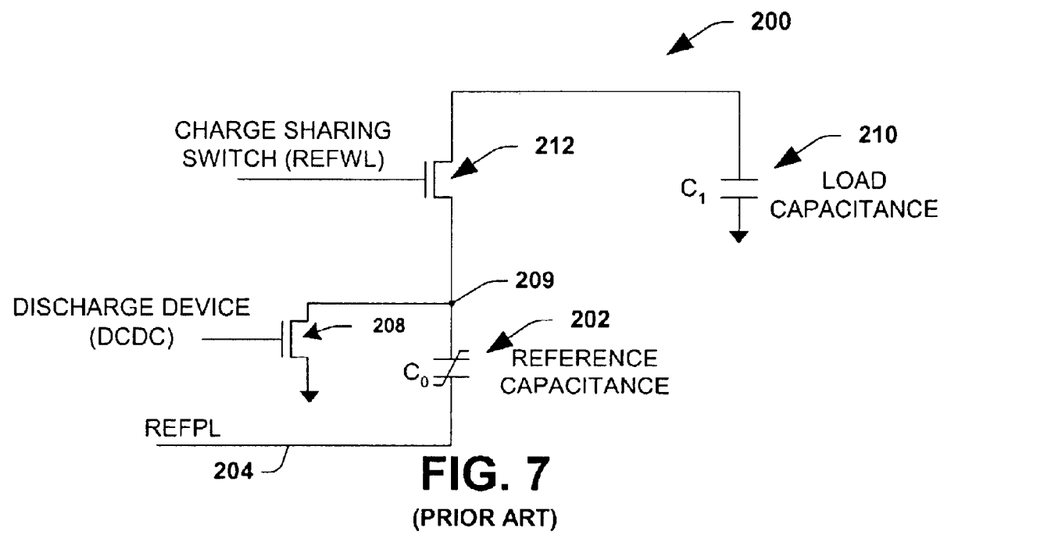
FIG. 7 is a schematic diagram illustrating a conventional U type reference voltage circuit.

FIG. 7 illustrates another conventional common type voltage reference circuit 200. The reference circuit 200 is sometimes referred to as a "U" reference. While some system designers employ a Da reference (circuit 100) due to its relative stability, others utilize the U reference circuit 200 because such reference may offer better signal tracking over temperature. The U reference circuit 200 includes a ferroelectric reference capacitor 202 having a plate line 204 coupled to a plate line signal REFPL. The other plate of the capacitor 202 is coupled to a discharge device 208 such as an NMOS transistor controlled by a signal DCDC. The plate is also coupled to a charge sharing switch 212 through a reference storage node RSN 209. The switch 212 (e.g., an NMOS transistor controlled by a signal REFWL) selectively couples the RSN 209 to a load capacitance 210.

In the U reference circuit 200, the plate node 204 is controlled with REFPL instead of being tied to ground as in the Da reference. The stability of the U reference is improved by controlling the history of the reference capacitor 202. In the case of constant precharge, the REFPL is held at $V_{DD}$ in standby. When the plate line 204 is high and the reference storage node 209 is held low (by transistor 208 being on), the ferroelectric reference capacitor 202 is at point 5 on the hysteresis loop of FIG. 4. After the capacitor 202 has been preconditioned to erase its history, REFPL goes low and the discharge device 208 is turned off. This returns the FeCap 202 back to point 6 on the hysteresis loop. REFWL then goes high to enable the charge sharing switch 212 while REFPL is again brought high. With the switch 212 on, the capacitor divider is formed with the FeCap 202 and the load capacitor 210, which determines the voltage at RSN 209 and at the REFOUT node. The capacitance value $C_0$ of the U reference circuit 200 may be higher than $C_0$ of the Da reference because of the non-linearity of the non-switching capacitance terms.

As can be seen from the above, the Da and U reference circuits 100 and 200 have their own advantages, however, since the U term starts near the axis and the Da term starts away from the axis, one may expect the terms to have difference temperature and voltage characteristics. Therefore the reference voltage provided thereby may differ for the same reference capacitor.

Figure 8A:
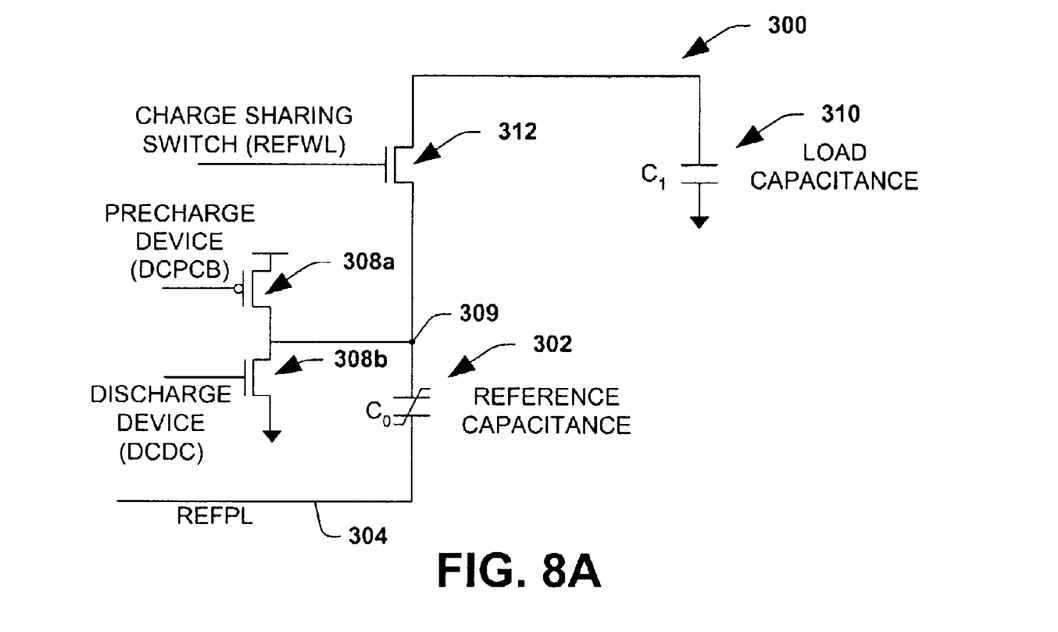
FIG. 8A is a schematic diagram illustrating a combined Da/U type reference voltage circuit.
Figure 8B:
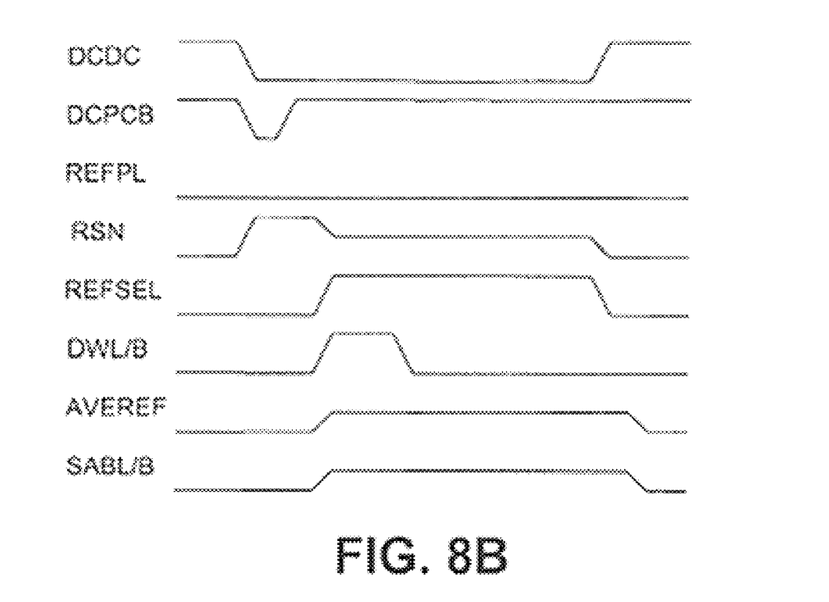
FIG. 8B is a timing diagram illustrating control signals for operation of the reference voltage circuit of FIG. 8A.

Since a given ferroelectric material of a fabrication process may make one reference circuit more advantageous than the other, and since knowledge of which circuit is better may not be available at the time of design implementation, a reference circuit that supports both the Da and U ferroelectric references is illustrated in FIG. 8A and designated at reference numeral 300. As can be appreciated from the discussion above, based on the biasing of REFPL and control of the precharge/discharge devices 308*a* and 308*b*, a capacitor divider may be employed to generate a reference voltage at REFOUT. An exemplary timing diagram illustrating operation thereof is provided in FIG. 8B.

Figure 8C:
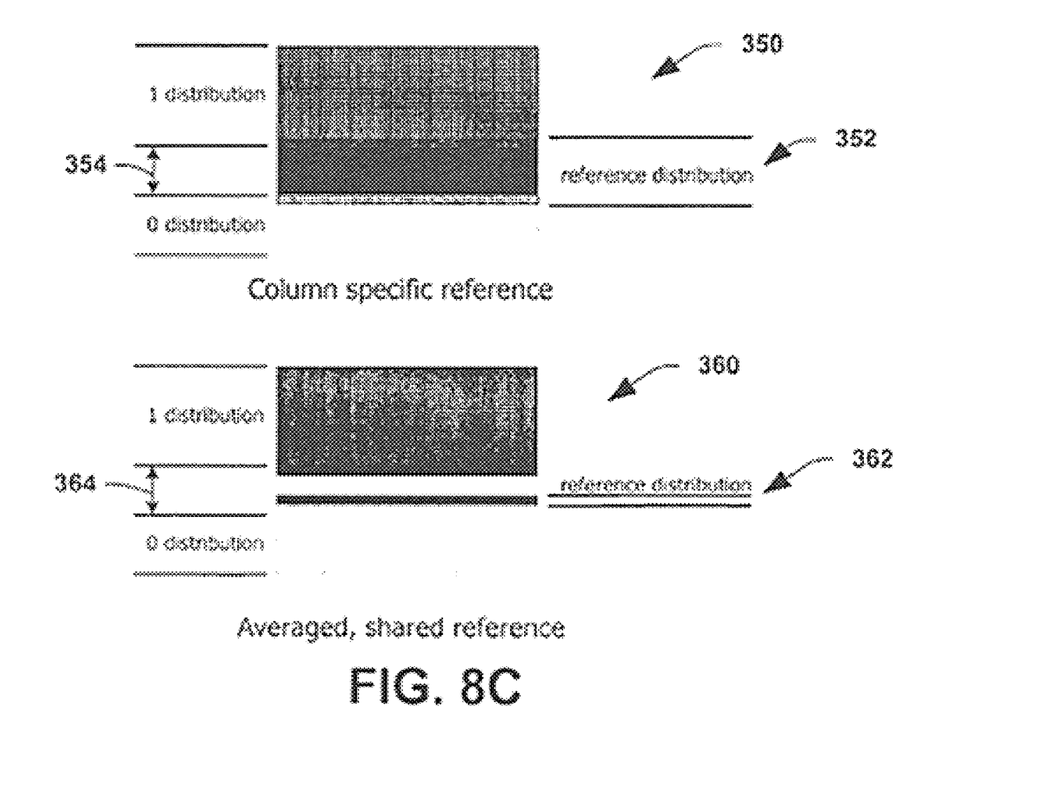
FIG. 8C is a diagram illustrating an impact of using an averaged, shared type reference methodology on the distribution of the resulting reference voltage.

Another concept that has been employed in reference voltage generation circuits for ferroelectric memories is reference averaging to improve signal margin. Particularly for small reference capacitors ($C_0$ in circuits 100, 200, 300), reference averaging helps tighten the distribution of the reference voltage. For example, as illustrated in FIG. 8C, a graphic 350 illustrates how a reference distribution 352 is relatively wide and in some cases can be larger than a sense margin window 354 for the process. As can be seen in the graphic 360, if the reference distribution can be made more tight, for example, by reference averaging, than it is smaller than the sense margin window 364 and provides better yield due to reduced read errors.

In reference averaging, individual reference capacitors associated with each bit line pair for a memory block (e.g., 32 BL/BLB pairs) have their storage nodes shorted together to create a single large "effective" ferroelectric capacitor that is shared by all the bit lines in the block. Further, by making each reference capacitor (FeCap) identical to the FeCaps in the 1T1C memory cells, process variations in ferroelectric material or the FeCap fabrication process are tracked by the reference capacitors.

As can be seen in FIG. 8C, although a tight distribution 362 for the generated reference voltage is advantageous, it is highly desirable to have the tight distribution centered within the sense margin window 364. As has been discussed above, however, in many instances the sense margin window 364 differs based on the type of sense method employed and upon the process utilized to fabricate the memory. Further, in many instances, such information is not known to the designer at the time the reference voltage circuit is to be designed.

Therefore the inventors of the present invention have developed a logic programmable reference voltage circuit that provides for varying the generated reference voltage value based on one or more inputs. The use of a logic programmable reference advantageously allows the reference voltage value to be adjusted based on, for example, materials characterization data, selected sense technique, temperature, time, circuit location, or other type data. One or more of the above pieces of data (as well as other data types) are input into a reference control circuit (e.g., a register, a plurality of programmable fuses, a state machine, or other type circuitry) that is configured to take such inputs and generate one or more control signals that control the programmable reference control circuit.

Figure 9:
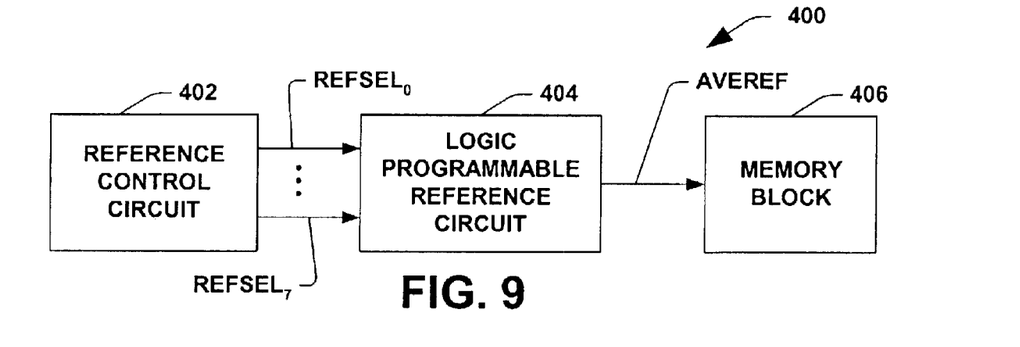
FIG. 9 is a block diagram illustrating a ferroelectric memory operable to provide a logic programmable reference voltage in accordance with the present invention.
Figure 10:
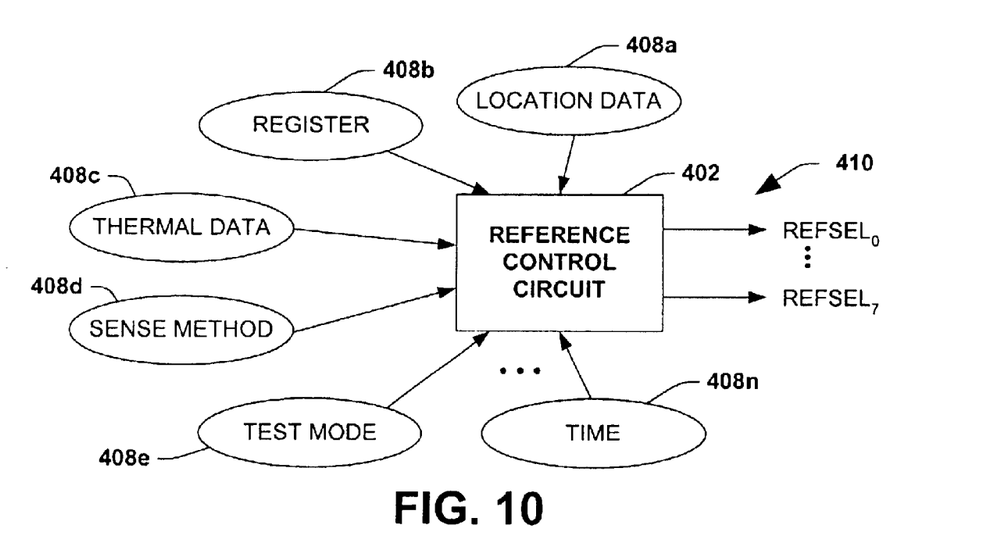
FIG. 10 is a block diagram illustrating a reference control circuit operable to generate a plurality of control signals based on one or more input conditions in accordance with an aspect of the present invention.

Turning now to FIG. 9, a block diagram is provided illustrating a ferroelectric logic programmable reference memory 400 according to an exemplary aspect of the present invention. The memory 400 comprises a reference control circuit 402 coupled to a logic programmable reference circuit 404 that in turn is coupled to one or more memory blocks 406. The reference control circuit 402 is illustrated in greater detail in accordance with one example in FIG. 10. In FIG. 10, the reference control circuit 402 is illustrated as receiving one or more of a plurality of inputs 408*a*–408*n* that represent a variety of different types of data or circuit conditions. For example, if the reference circuit 404 is designed concurrently with the ferroelectric material characterization and process integration, the characterization data associated with the FeCaps employed in the design may not be available during the circuit design. However, such characterization data may then be input (e.g., via a register 408*b* at probe test) and employed by the control circuit 402 to generate the control signals 410 for setting the reference voltage value.

In another example, if it is determined that the location of various memory blocks on a die or the location of a die on a wafer has an impact on the sense margin window or otherwise impacts the desired reference voltage value, location data 408*a* may be employed, and in such instances the reference voltage generated may be a function of such location data. Further, if the FeCaps are characterized and exhibit a sense margin window that moves with respect to temperature or the voltage generation circuit moves with temperature, for example, temperature data 408c (obtained, for example, by thermal sense circuitry located near the memory block at issue) may be input to the control circuit 402 such that the control signals 410 account for the detected thermal state. Further still, if characterization reveals that "after-pulse" sensing provides a different sense margin window than "on-pulse" sensing for the process or design at issue, sense method data 408d may be provided to indicate which sense method is being employed.

In yet another example, if the memory is operating in a test mode for purposes of characterization, test mode data 408e may be input to identify the test mode or type of test mode if various modes exist (as opposed to a standard operation mode, for example). In such an instance, the control circuit 402 may generate a series of control signals in a controlled fashion to characterize the design over a range of reference voltages, for example. In addition, if process and/or design characterization indicates that the sense margin changes and/or moves over time, time data 408n (e.g., via a clock circuit or other type timer) may be provided to the reference control circuit 402 so that the control signals 410 may vary the value produced by the reference voltage generation circuit 404 over time. The above input data 408a–408n are merely provided as exemplary types of input data. It should be understood that other types of data may be helpful and can be used to control the programmable reference voltage circuit and such data is contemplated as falling within the scope of the present invention.

Figure 11:
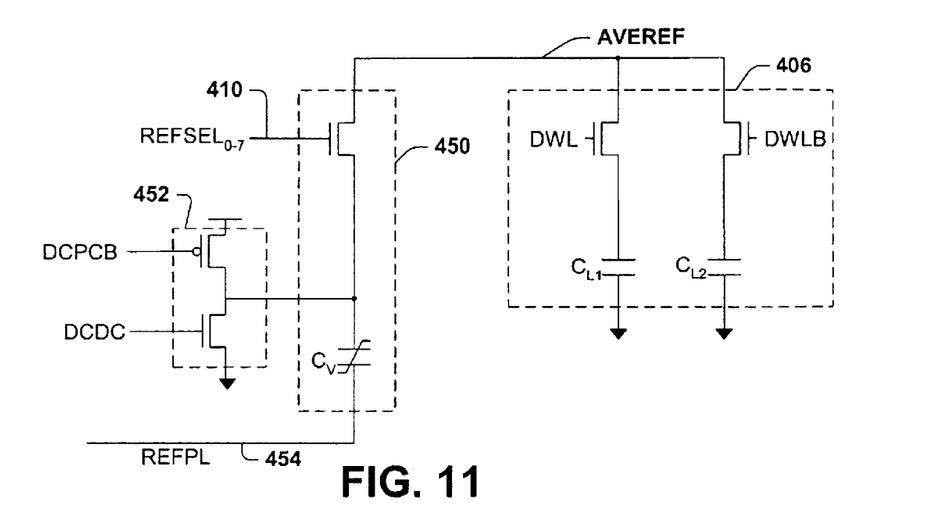
FIG. 11 is a schematic diagram illustrating a logic programmable reference circuit operable to generate a reference voltage based on the control signals from the reference control circuit according to another aspect of the present invention.

FIG. 11 is a schematic diagram illustrating a logic programmable reference circuit 404 in accordance with an aspect of the present invention. The circuit 404 receives a plurality of control signals 410 (REFSELD-$_{0-7}$) and, in conjunction with the memory block 406, generates a reference voltage having a value that is a function of the input control signals 410. The circuit 400 comprises a variable reference capacitance circuit 450 and a precharge/discharge circuit 452. The precharge/discharge circuit is operable to charge or discharge the capacitance of the variable capacitance circuit 450 based on control signals DCPCB and DCDC, respectively, depending on whether a Da or U type reference circuit is desired. The variable capacitance ($C_v$) of the circuit 450 is coupled to a reference plate line signal 454 (REFPL) that operates in conjunction with the circuit 452 to provide a Da or U type reference and an "after-pulse" or "on-pulse" sense technique, as may be desired.

Figure 12:
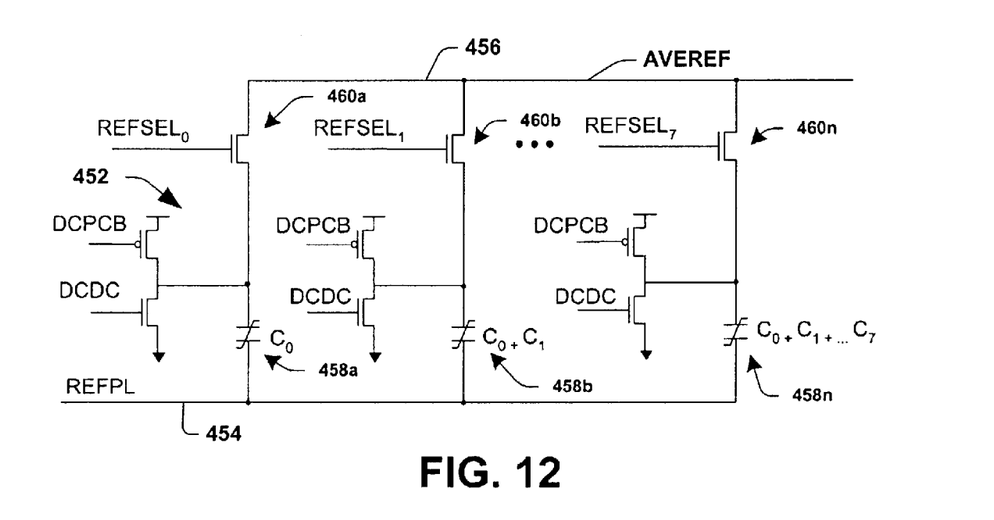
FIG. 12 is a schematic diagram illustrating a variable capacitance circuit portion of the logic programmable reference circuit in accordance with yet another aspect of the present invention.
Figure 13A:
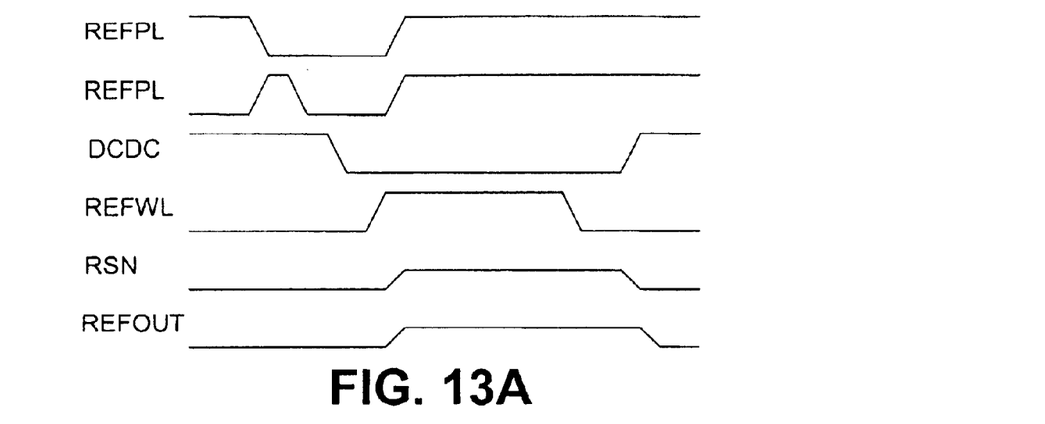
FIGS. 13A and 13B are timing diagrams illustrating an exemplary operation of the circuits of FIGS. 11 and 12 in a Da or U type reference mode in accordance with an aspect of the present invention.
Figure 13B:
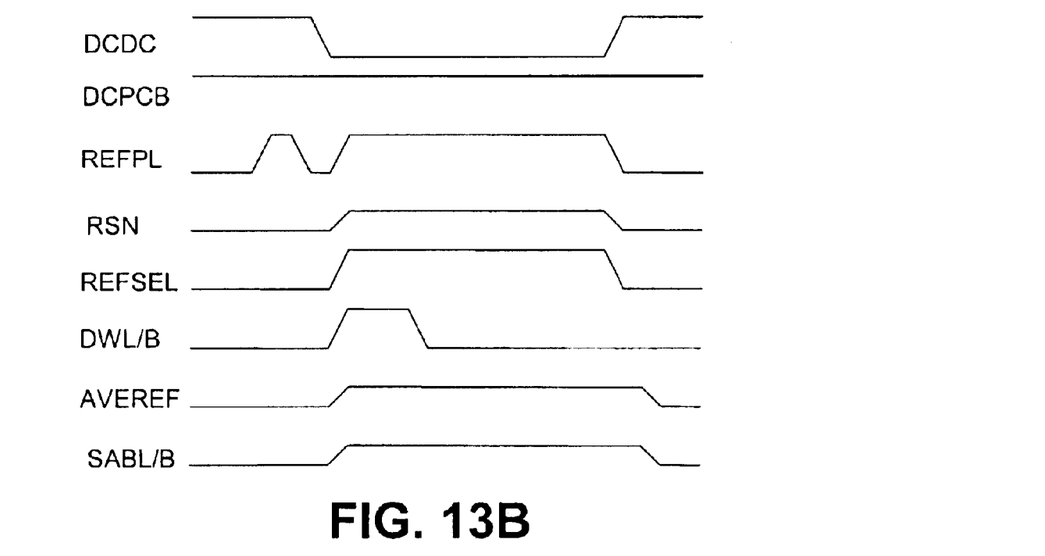

In operation, the control signals 410 operate to vary an amount of capacitance associated with the variable capacitance $C_v$. The variable capacitance is then coupled to a bit line or shared with a plurality of bit lines in a memory block 406 to form a capacitor divider that defines the reference voltage at node 456 (e.g., AVEREF). One exemplary circuit for providing the above operation is illustrated in FIG. 12. In the circuit of FIG. 12, a plurality of charge/discharge circuits 452 are coupled to ferroelectric capacitors 458a–458n having different values ($C_0$, $C_0+C_1$, ... $C_0+C_1+...+C_7$). Each capacitance 458a–458n is coupled between the plate line 454 and the output node 456 through its own selection switch 460a–460n. The selection switches 460a–460n are each individually controlled by one of the plurality of control signals 410. Exemplary operation of the circuit in a Da or U type reference circuit mode is illustrated in FIGS. 13A and 13B, respectively.

Based on the state of the input control signals 410, one or more of the capacitances 458a–458n are coupled together in parallel between the plate line 454 and the output 456 to form a reference capacitance ($C_v$). For example, if REFSEL$_0$ and REFSEL$_1$ signals are high and REFSEL$_{2-7}$ are low, $C_v=C_0+(C_0+C_1)$. In accordance with one exemplary aspect of the present invention, the capacitors 458a–458n are ferroelectric capacitors and are weighted with respect to one another in a binary fashion, wherein $C_0$, $C_1$, ... $C_7$ are identical capacitance values, however, the present invention alternatively contemplates using traditional type capacitors and differing capacitance values. Accordingly, in the present example, by selecting various switches 410, a reference capacitance value $C_v$ having a range between $C_0$ and $128C_0$ may be obtained with a resolution value of $C_0$ (wherein each capacitor comprises an identical ferroelectric capacitor that is identical to the memory cells), thereby providing a substantially wide range of reference capacitance values. This arrangement then results in a range of available reference voltages, since:

$$V_{REF}=V_{DD}(C_V/(C_V+C_L)).$$

Figure 14:
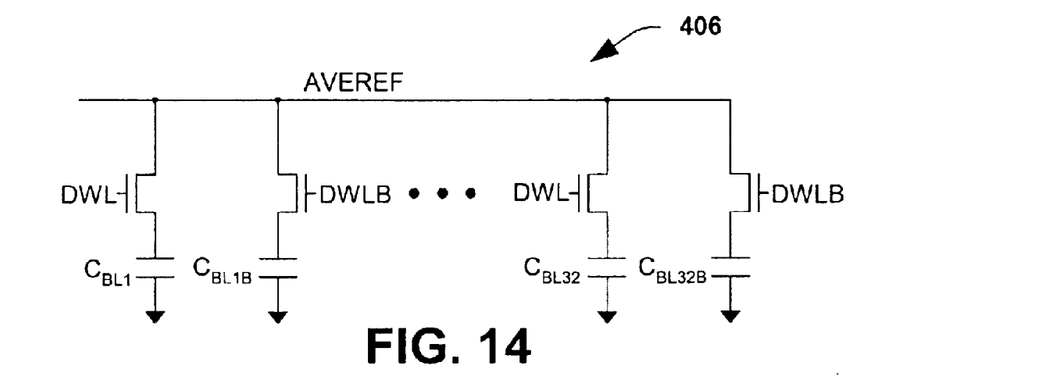
FIG. 14 is a schematic diagram illustrating a memory block circuit having a plurality of bit line pairs coupled to the logic programmable reference circuit to form an averaged, shared voltage reference in accordance with an exemplary aspect of the present invention.

Returning to FIG. 11, the memory block 406 is illustrated as a single BL/BLB pair, one of which is selected via DWL and DWLB signals that selectively enable transistors to couple a bit line and its associated capacitance (illustrated in this example as $CL_1$ and $CL_2$) to the node 456 as the load capacitance $C_L$. The load capacitance $C_L$ forms a capacitor divider with the variable reference capacitance $C_V$ to generate the reference voltage at the output node 456. In another example, the memory block 406 comprises a plurality of bit line pairs (e.g., thirty-two (32) pairs) selectively coupled in parallel between the output node 456 and ground with select switches controlled by DWL and DWLB, respectively, as illustrated in FIG. 14. In addition, in the present example, the logic programmable reference circuit is provided for the thirty-two column memory block so the effective reference can reach a maximum of four (4) reference capacitors per column. However, it should be appreciated that other variations may be employed and are contemplated as falling within the scope of the present invention.

Figure 15A:
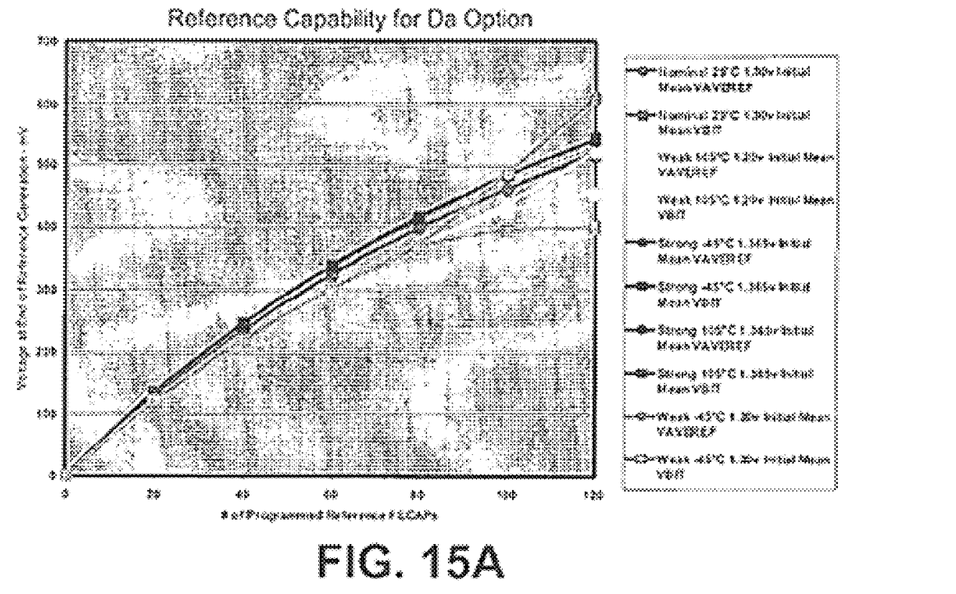
FIGS. 15A and 15B are graphs illustrating an amount of reference voltage variation capable in the programmable voltage reference of the present invention in the Da option and the U option, respectively.
Figure 15B:
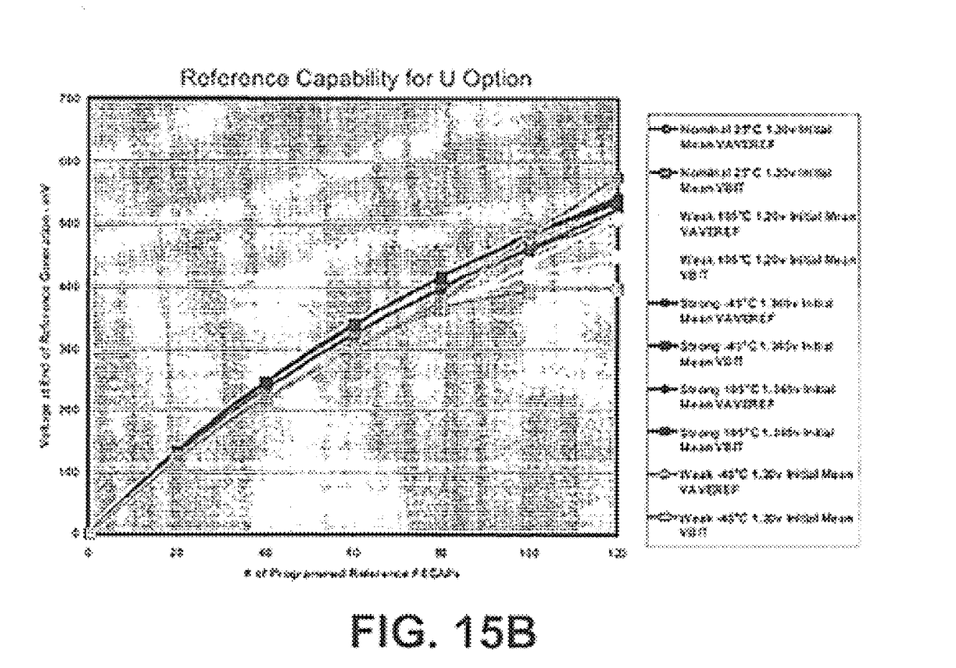

In order to more fully appreciate how the logic programmable reference circuit of the present invention provides a variable reference voltage value, FIGS. 15A and 15B are provided. FIG. 15A illustrates the circuit of FIG. 11 configured in the Da reference option. Note that by bringing in more reference capacitors (to alter the reference capacitance CV) along the x-axis, the resultant reference voltage also varies along the y-axis. In addition, as can be seen with the divergence based on different temperatures and weak/strong device models, the resultant reference value also varies for a given number of capacitors. By identifying such conditions, the reference control circuit 402 generates the necessary controls signals 410 to obtain the needed reference capacitance CV to minimize read errors.

Similarly, FIG. 15B illustrates the circuit of FIG. 11 operating in the U reference option. Note that in the U option, the reference voltage value (y-axis) can be altered in a similar manner by varying the capacitance (x-axis).

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A memory device, comprising:
    a logic programmable capacitance reference circuit adapted to generate a reference voltage during a sense mode of operation, wherein the reference voltage comprises a value that is a function of one or more memory conditions;
    a bit line pair, wherein a first bit line of the bit line pair has a ferroelectric capacitor coupled thereto for sensing thereof, and a second bit line of the bit line pair is coupled to the reference voltage; and
    a sense circuit coupled to the bit line pair, and operable to detect a data state associated with the ferroelectric capacitor using a voltage associated with the first bit line and the reference voltage on the second bit line.

2. The memory of claim 1, wherein the one or more memory conditions comprises one of an after-pulse sense technique and an on-pulse sense technique.

3. The memory of claim 1, wherein the one or more memory conditions comprises a temperature associated with the memory.

4. The memory of claim 1, wherein the one or more memory conditions comprises one of a location of the ferroelectric capacitor on a semiconductor die and a location of the die on a semiconductor wafer.

5. The memory of claim 1, wherein the one or more memory conditions comprises characterization data associated with the ferroelectric capacitor.

6. The memory of claim 1, wherein the logic programmable capacitance reference circuit further comprises:
    a reference control circuit configured to receive one or more input signals associated with the one or more memory conditions and generate one or more output signals in response thereto;
    a variable capacitance reference circuit coupled to the reference control circuit and receiving the one or more output signals thereof, operable to generate a capacitance having a value that is a function of the one or more output signals of the reference control circuit,
    wherein the capacitance of the variable capacitance reference circuit couples to one of the bit lines in the bit line pair and forms a capacitive divider therewith, thereby defining the reference voltage.

7. The memory of claim 6, further comprising a plurality of bit line pairs collectively forming a memory block, wherein the capacitance of the variable capacitance reference circuit couples to one of the bit lines in each of the plurality of bit lines pairs and forms a shared capacitive divider therewith, thereby defining the reference voltage that serves as a shared reference voltage for each of the bit line pairs.

8. The memory of claim 6, wherein the variable capacitance reference circuit further comprises a plurality of capacitive loading circuits selectively coupled together to an output node, wherein each of the capacitive loading circuits are connected to the output node based on a state of the one or more output signals, wherein a number of the plurality of capacitive loading circuit coupled together to the output node defines an amount of capacitance thereon.

9. A ferroelecteric memory, comprising:
    an array of ferroelectric memory cells organized in a 1T1C type architecture having a plurality of bit line pairs;
    a sense amplifier circuit selectively coupled across the pair of bit lines, and operable to generate an output state based on a voltage difference between the pair of bit lines; and
    a logic programmable capacitance reference circuit selectively coupled to one of the pair of bit lines, and operable to generate a reference voltage during a sense mode of operation, wherein a value of the reference voltage is variable and a function of one or more memory conditions.

10. The ferroelectric memory of claim 9, wherein the logic programmable capacitance reference circuit comprises:
    a reference control circuit configured to receive one or more input signals associated with the one or more memory conditions and generate one or more output signals in response thereto;
    a variable capacitance reference circuit coupled to the reference control circuit and receiving the one or more output signals thereof, operable to generate a capacitance having a value that is a function of the one or more output signals of the reference control circuit,
    wherein the capacitance of the variable capacitance reference circuit couples to one of the bit lines in the bit line pair and forms a capacitive divider therewith, thereby defining the reference voltage.

11. The ferroelectric memory of claim 10, wherein the reference control circuit receives one or more signals indicative of the one or more memory conditions and generates a multi-bit control word that dictates a capacitance value of the variable capacitance reference circuit.

12. The ferroelectric memory of claim 11, wherein the variable capacitance reference circuit comprises a plurality of capacitors coupled together in parallel through a plurality of control switches, respectively, wherein each of the plurality of control switches are connected to one of the bits of the multi-bit control word, and wherein based on a state of the multi-bit control word, a selected one or more of the control switches are activated to coupled their respective capacitors together in parallel to generate a reference capacitance.

13. The ferroelectric memory of claim 12, wherein the plurality of capacitors comprise ferroelectric capacitors.

14. The ferroelectric memory of claim 13, wherein the plurality of ferroelectric capacitors are substantially identical in size as ferroelectric capacitors within the ferroelectric memory cells.

15. The ferroelectric memory of claim 13, wherein each of the plurality of ferroelectric capacitors have differing capacitance values in accordance with a binary weighting thereof.

16. The ferroelectric memory of claim 10, wherein the capacitance of the variable capacitance reference circuit couples to one of the bit lines in each of the plurality of bit lines pairs and forms a shared capacitive divider therewith, thereby defining the reference voltage that serves as a shared reference voltage for each of the bit line pairs.

17. A 1T1C ferroelectric memory device, comprising:

a plurality of bit lines pairs, having ferroelectric memory cells selectively coupled thereto;

a sense amplifier circuit coupled across a bit line pair, and operable to generate an output state indicative of a voltage difference across the bit line pair associated therewith;

a logic programmable capacitance reference circuit operable to generate a reference voltage having a value that is a function of one or more memory conditions, the logic programmable capacitance reference circuit further comprising:

a variable capacitance reference circuit comprising a plurality of ferroelectric capacitors selectively coupled together in parallel via a plurality of control switches, respectively, wherein a state of the control switches is dictated by the one or more memory conditions, thereby defining a capacitance value that is a function of the one or more memory conditions, wherein the plurality of bit line pairs collectively form a memory block, and wherein the capacitance of the variable capacitance reference circuit couples to one of the bit lines in each of the plurality of bit line pairs, and forms a capacitive divider therewith, thereby defining the reference voltage that serves as a shared reference voltage for each of the bit line pairs.

* * * * *